(12) United States Patent
Khan et al.

(10) Patent No.: US 8,754,501 B2
(45) Date of Patent: Jun. 17, 2014

(54) INTEGRATION OF PRECISION MIM CAPACITOR AND PRECISION THIN FILM RESISTOR

(71) Applicant: Texas Instruments Incorporated, Dallas, TX (US)

(72) Inventors: Imran Mahmood Khan, Richardson, TX (US); John Paul Campbell, Dallas, TX (US); Neal Thomas Murphy, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/918,388

(22) Filed: Jun. 14, 2013

(65) Prior Publication Data

US 2013/0341759 A1     Dec. 26, 2013

Related U.S. Application Data

(60) Provisional application No. 61/660,053, filed on Jun. 15, 2012.

(51) Int. Cl.
*H01L 27/06*    (2006.01)

(52) U.S. Cl.
USPC ........... 257/533; 257/303; 257/347; 257/369; 257/506; 257/532

(58) Field of Classification Search
CPC ............ H01L 27/0288; H01L 27/0629; H01L 27/0635; H01L 27/0647; H01L 27/067; H01L 27/0676
See application file for complete search history.

(56) References Cited

U.S. PATENT DOCUMENTS

2011/0248333 A1*   10/2011   Meotto et al. ................. 257/324

\* cited by examiner

*Primary Examiner* — Kyoung Lee
(74) *Attorney, Agent, or Firm* — Wade J Brady, III; Frederick J. Telecky, Jr.

(57) ABSTRACT

An integrated circuit with a high precision MIM capacitor and a high precision resistor with via etch stop landing pads on the resistor heads that are formed with the capacitor bottom plate material. A process of forming an integrated circuit with a high precision MIM capacitor and a high precision resistor where via etch stop landing pads over the resistor heads are formed using the same layer that is used to form the capacitor bottom plate.

14 Claims, 8 Drawing Sheets

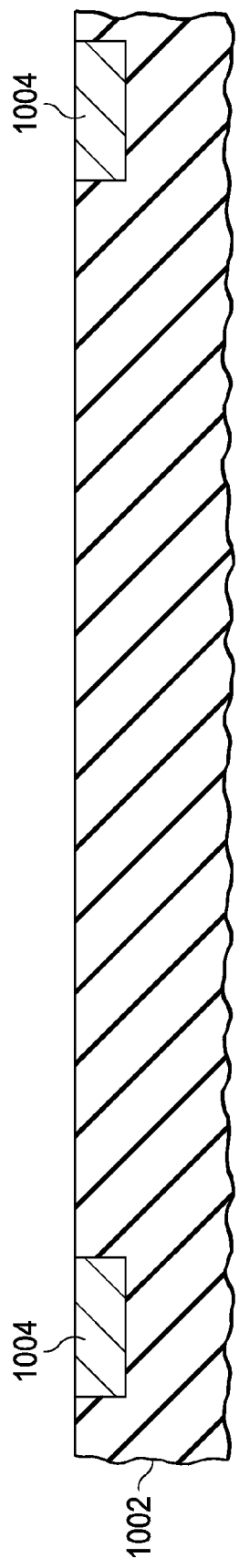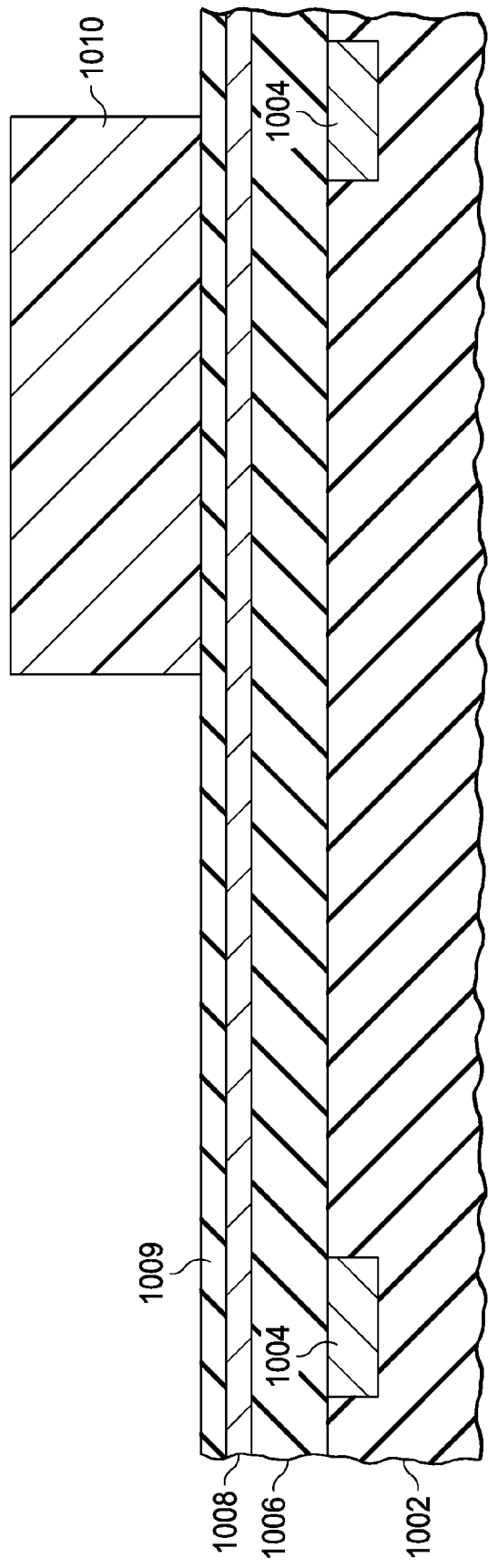

INTEGRATION OF PRECISION MIM CAPACITOR AND PRECISION THIN FILM RESISTOR

FIELD OF THE INVENTION

This invention relates to the field of integrated circuits. More particularly, this invention relates to fabricating MIM capacitors and high precision thin film resistors.

BACKGROUND OF THE INVENTION

Metal-insulator-metal (MIM) capacitors are well known. They are typically formed within the interconnect layers of an integrated circuit by depositing a metallic bottom plate, depositing a capacitor dielectric and then depositing, patterning and etching a metallic top plate. Typically to save cost and processing steps the top or bottom plate of the MIM capacitor may be formed using one of the layers of interconnect. For high precision MIM capacitors, however, the top and bottom plates are typically formed using separate metallic layers such as TaN and are not formed using interconnect material.

Metal resistors also may be formed within the interconnect layers of an integrated circuit. In some instances when both a MIM capacitor and a metal resistor are required, one of the plates of the MIM capacitor may be formed using an interconnect layer and the the other MIM capacitor plate material may also be used to form a metal resistor. While a process such as this may be used for many metal resistors, high precision metal resistors typically are formed of a very thin layer of a metallic material such as nichrome (NiCr), sichrome (SiCr), or TaSiN. These very thin metallic layers typically are too resistive to be used as a MIM capacitor plate.

In contrast to resistors located in the silicon substrate which suffer from relatively large parasitic capacitance to the substrate, metallic resistors have much less parasitic capacitance, since they are formed in the interconnect layers which are farther removed from the substrate. Hence, metallic resistors are preferred for high frequency RF applications.

A typical process flow for integrating a precision thin film metallic resistor into an integrated circuit manufacturing flow containing a high precision MIM capacitor may add three or four additional patterning steps and several thin film deposition and etch steps. One masking and etching step may be used to define the resistor which may be formed of a very thin film on the order of 1 nm to 10 nm to achieve high values of resistance. Since the resistor material is so thin, a special resistor contact pattern and etch may be required to form good electrical contact without damage to the thin resistor material. An alternative method that is used forms conductive etch stop landing pads over the heads of the thin film resistor which adds additional deposition, patterning, and etching steps. The addition of a high precision metal resistor to an integrated circuit manufacturing flow that also contains a high precision MIM capacitor typically adds significant additional cycletime and cost.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with a high precision MIM capacitor and a high precision resistor with via etch stop landing pads formed on the resistor heads using the same material that is used to form the capacitor bottom plate is formed.

DESCRIPTION OF THE VIEWS OF THE DRAWING

FIG. 1A through FIG. 1H are illustrations of steps in the fabrication of integrated circuits formed according to embodiments.

DETAILED DESCRIPTION

Figure 1C:
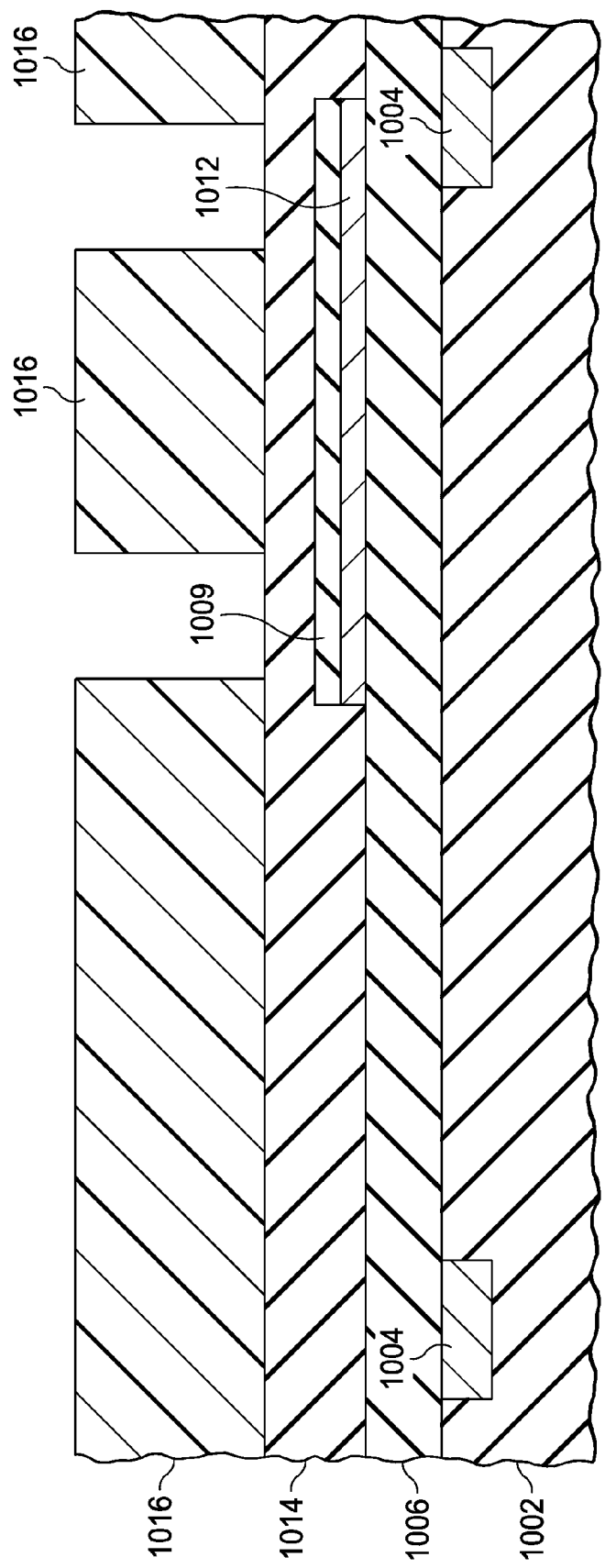

The present invention is described with reference to the attached FIG.ures, wherein like reference numerals are used throughout the FIG.ures to designate similar or equivalent elements. The FIG.ures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments illustrating structures and methods for integrating a high precision metallic resistor and a high precision MIM capacitor into an integrated circuit process flow with reduced cost are illustrated in FIG.S. 1A through 1H. By forming via etch stop landing pads on the heads of the precision resistor using the metal bottom plate of the MIM capacitor, the cost and cycle time of forming the precision resistor via etch stop landing pads using separate thin film deposition, pattern, and etch processing steps may be avoided.

FIG. 1A shows an interconnect layer 1004 formed on substrate 1002. Substrate 1002 may be an integrated circuit and interconnect level 1004 may be the first or higher level of interconnect.

In FIG. 1B a first layer of dielectric 1006 is deposited, high precision resistor material 1008 is deposited, and a hard mask layer 1009 is deposited. Then the stack composed of the hard mask plus the high precision resistor material is patterned with photoresist 1010. In an example embodiment, first layer dielectric 1006 may be approximately 50 nm of TEOS, the high precision thin film resistor material may be approximately 3.4 nm of SiCr and the hard mask material 1009 may be approximately 10 nm of silane based oxide.

The resistor 1012 is formed by etching the hard mask 1009 and the thin film resistor layer 1008 and then removing thin film resistor photoresist pattern 1010 in FIG. 1C. A second dielectric layer 1014 is then deposited and photoresist pattern 1016 is formed with openings over the heads of the SiCr resistor 1012. In the example embodiment dielectric layer 1014 is 130 nm TEOS.

Figure 1D:
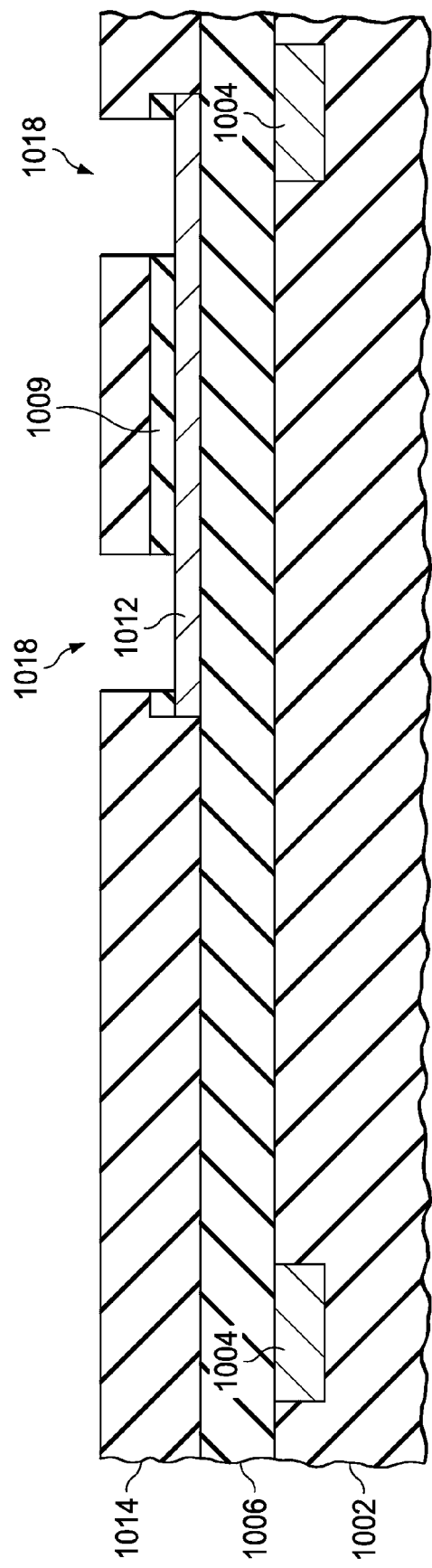

Via openings 1018 are etched to the resistor 1012 heads and photoresist pattern 1016 is removed in FIG. 1D.

Figure 1E:
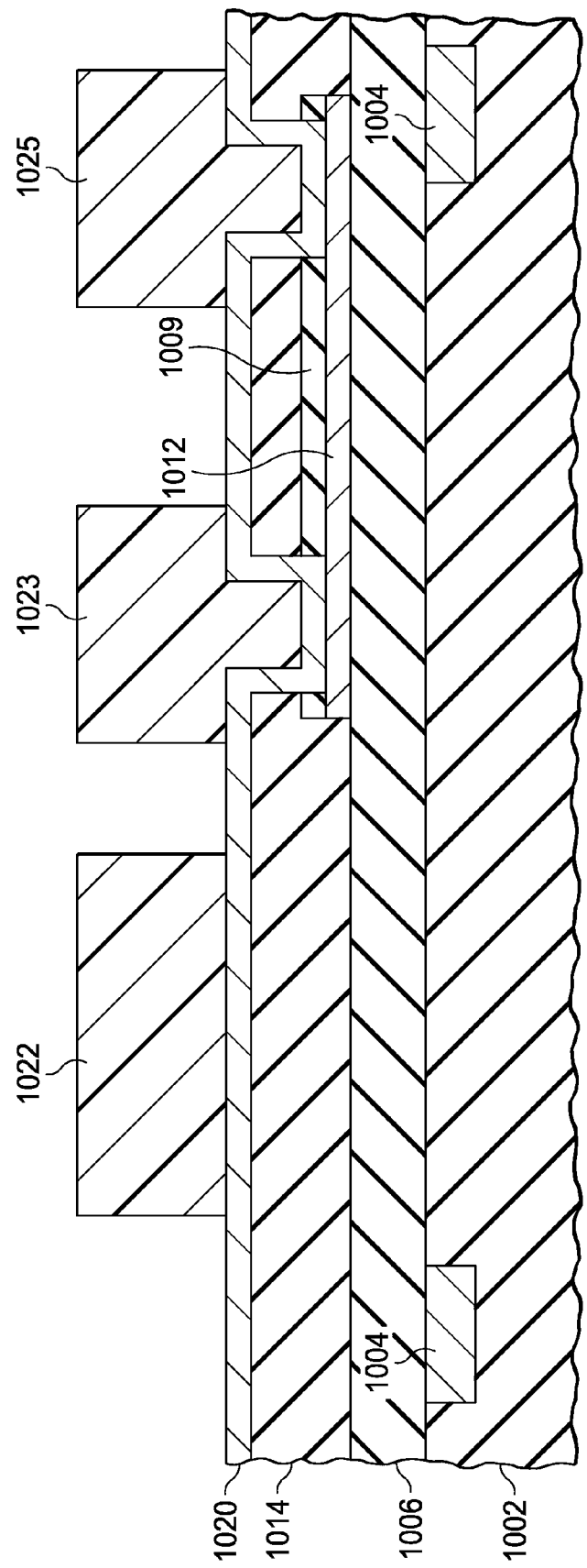

In FIG. 1E the capacitor bottom plate material 1020 is deposited and patterned 1022. Photoresist pattern 1022 is over where the MIM capacitor bottom plate is formed and photoresist patterns 1023 and 1025 are over where etch stop landing pads for the resistor 1012 heads are formed. The capacitor bottom plate may be formed of Ta, TaN or stacked layers of Ta and TaN.

Figure 1F:
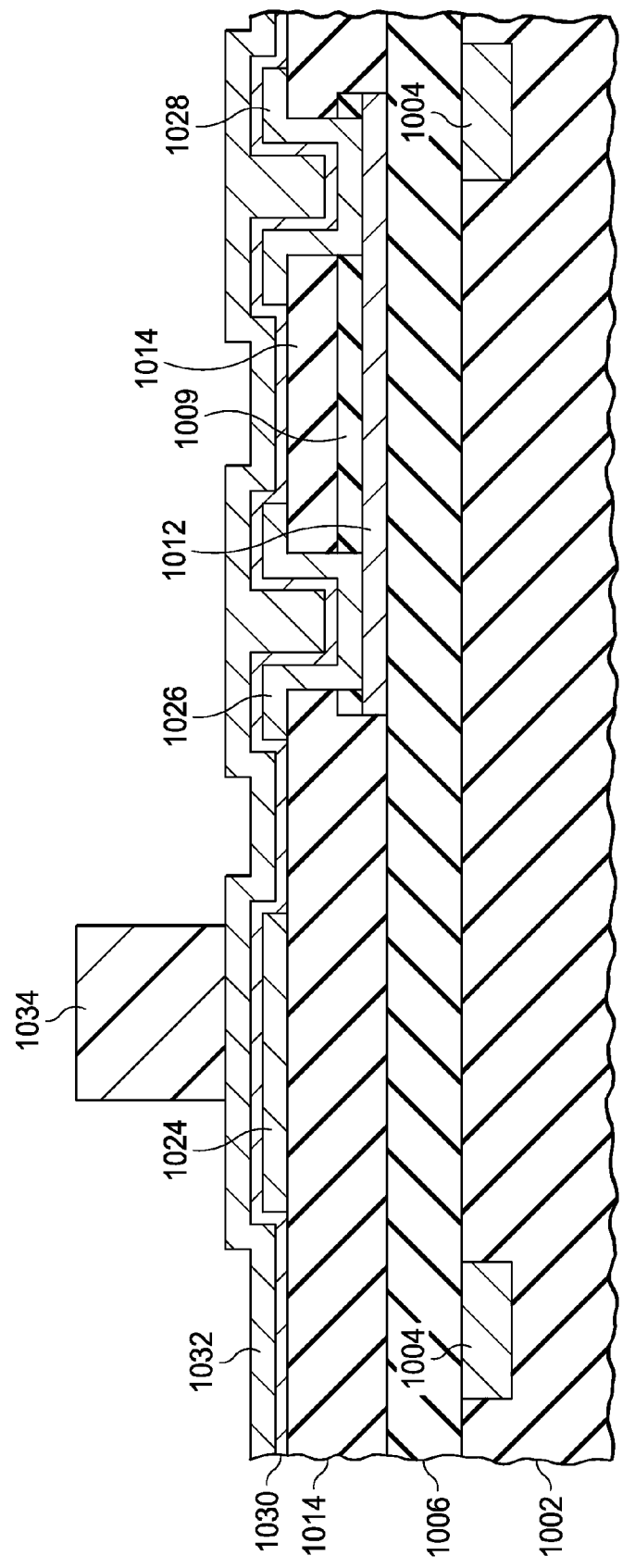

As shown in FIG. 1F, after layer 1020 is etched, to form capacitor bottom plate 1024 and etch stop landing pads 1026 and 1028 for the resistor 1012 heads, photoresist pattern 1022 is removed. High precision capacitor dielectric layer 1030 and capacitor top plate layer 1032 are then deposited. A photoresist pattern 1034 to form the capacitor top plate is formed on the capacitor top plate layer 1032. The capacitor dielectric 1030 may be silicon nitride, silicon dioxide, silicon oxynitride, a high-K dielectric, or stacked layers of these dielectrics. The capacitor top plate 1032 may be formed of the same material as the capacitor bottom plate 1024. High precision MIM capacitor top plate pattern 1034 is then formed on capacitor top plate material layer 1032. In an example embodiment the capacitor top 1032 bottom 1024 plate material is approximately 68 nm Ta and the capacitor dielectric 1030 is approximately 30 nm silicon nitride.

Figure 1G:
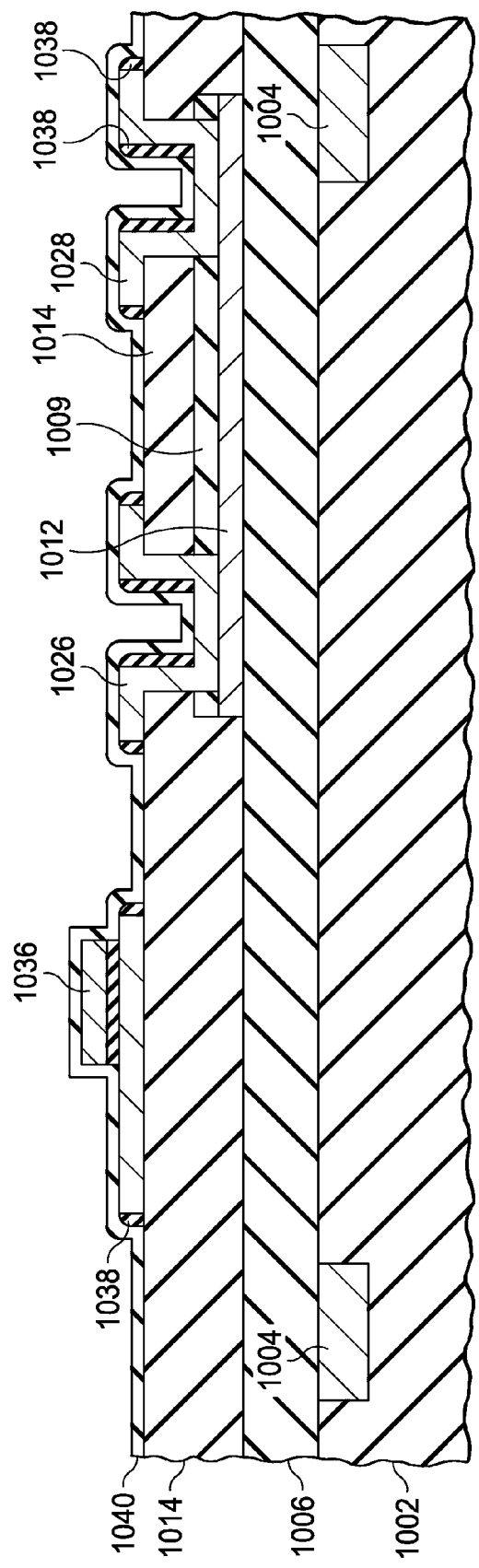

In FIG. 1G, the high precision MIM capacitor top plate 1036 is formed by etching top capacitor layer 1032 and then removing the photoresist pattern 1034. After etch, sidewalls 1038 composed of capacitor dielectric material 1030 or capacitor dielectric 1030 and capacitor top plate 1032 material may remain on the vertical surfaces of the capacitor bottom plate 1024 and on the vertical surfaces of the etch stop via landing pads 1026 and 1028. Capacitor encapsulation layer 1040 which may also function as an etch stop layer is then deposited as shown in FIG. 1G. In the example embodiment the encapsulation layer 1040 is approximately 70 nm silicon nitride.

Figure 1H:
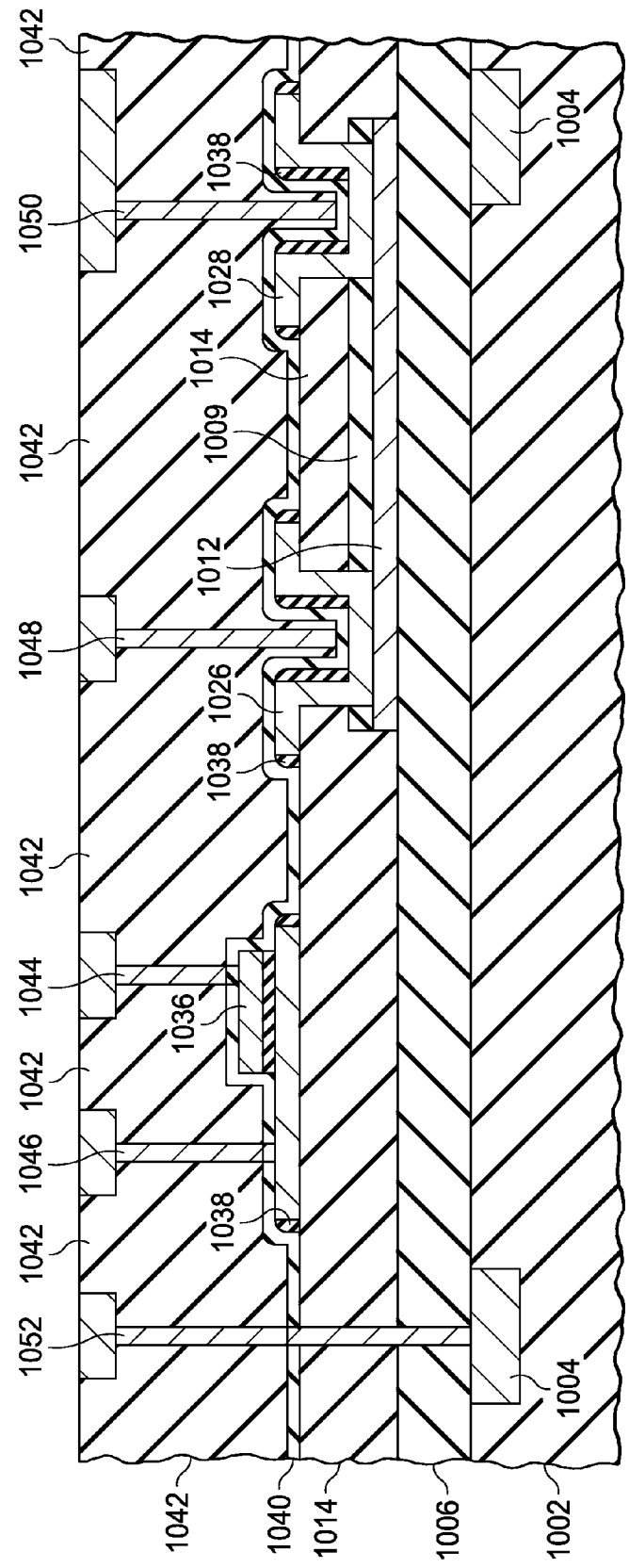

Inter metal level dielectric (IMD) layer 1042 is deposited as shown in FIG. 1H. Layer 1042 may then be planarized using a process such as chemical mechanical polishing (CMP) or resist etchback (REB). An interconnect layer is formed in dielectric layer 1042 with vias 1052 to underlying interconnect 1004 or circuitry, via 1046 to the high precision MIM capacitor bottom plate, via 1044 to the capacitor top plate, an vias 1048 and 1050 to the heads of the high precision thin film resistor 1012.

Additional layers of interconnect and dielectric may be formed to complete the integrated circuit.

Figure 2:
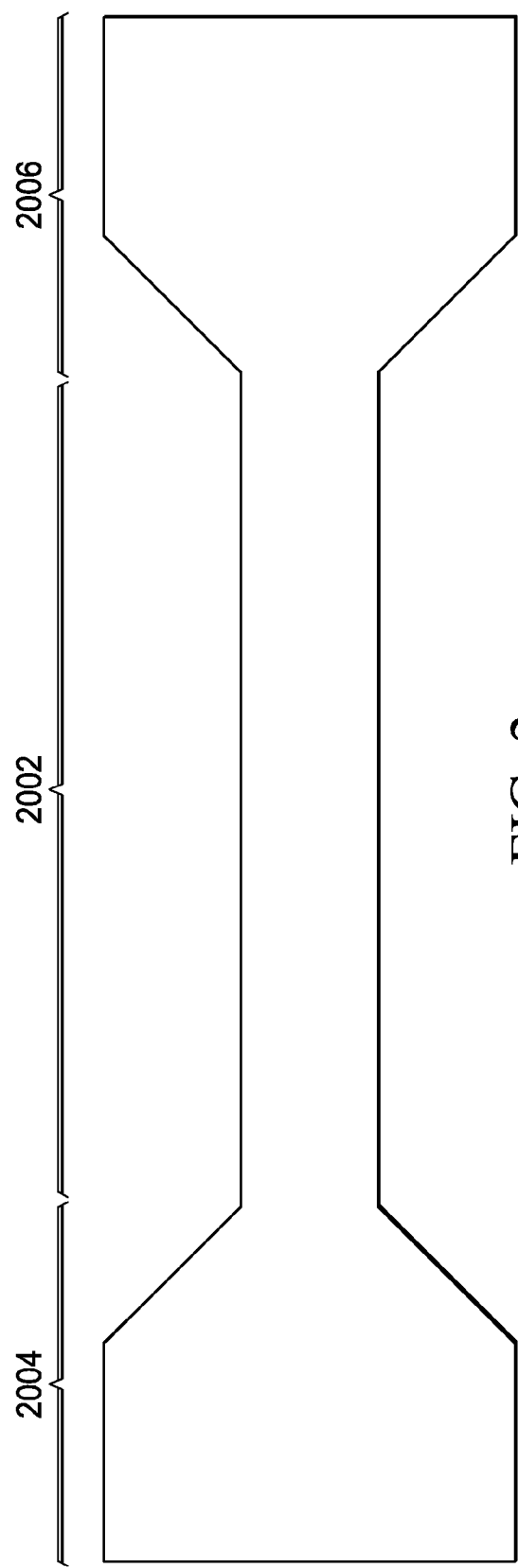
FIG. 2 is a top down view of a high precision resistor formed according to embodiments.

A top down view of a high precision thin film resistor is illustrated in FIG. 2. The high precision thin film resistor has a resistor body 2002 and resistor heads 2004 and 2006. A via etch stop landing pad may be formed in an opening over each resistor head. The via etch stop landing pads may then be connected to an overlying interconnect layer with one or more vias. The resistor body, 2002, may be a single geometry as shown in FIG. 2, or may be a serpentine line with various width and length depending upon resistance requirements.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a high precision MIM capacitor with a capacitor bottom plate, a capacitor dielectric and a capacitor top plate; and
   a high precision thin film resistor with an etch stop landing pad on a head of said high precision thin film resistor where said etch stop landing pad and said capacitor bottom plate are formed using a same metallic layer.

2. The integrated circuit of 1 where said etch stop landing pad and said capacitor bottom plate are Ta, TaN or stacked layers of Ta and TaN.

3. The integrated circuit of 1 where said MIM capacitor is formed with a bottom plate consisting of Ta, TaN, or stacked layers of Ta and TaN; a capacitor dielectric consisting of silicon dioxide, silicon nitride, silicon oxynitride, or high-K capacitor dielectric or stacked layers of at least two of silicon dioxide, silicon nitride, silicon oxynitride or high-K dielectric; and a top plate consisting of Ta, TaN, or stacked layers of Ta and TaN; and where said high precision thin film resistor consists of NiCr, SiCr, or TaSiN.

4. The integrated circuit of claim 3 where said bottom plate is approximately 68 nm, said capacitor dielectric is approximately 30 nm, said capacitor top plate is approximately 68 nm, and said high precision thin film resistor is approximately 3.4 nm SiCr.

5. The integrated circuit of claim 3 where said bottom plate is approximately 68 nm TaN, said capacitor dielectric is approximately 30 nm silicon nitride, said capacitor top plate is approximately 68 nm TaN, and said high precision thin film resistor is approximately 3.4 nm SiCr.

6. The integrated circuit of claim 1 further comprising a hard mask on top of said high precision thin film resistor.

7. The integrated circuit of claim 6 where said hard mask layer is approximately 10 nm of silane based oxide.

8. A process of forming an integrated circuit, comprising the steps:
   providing a substrate containing partially formed said integrated circuit with at least one interconnect layer;
   depositing a first dielectric layer over said interconnect layer;
   depositing thin film resistor material on said first dielectric layer;
   depositing a hard mask on said thin film resistor material;
   forming a thin film resistor photoresist pattern on said etch top layer;
   etching said hard mask;
   etching said thin film resistor material to form a thin film resistor with resistor head and a resistor body;
   depositing a second dielectric layer over said high precision resistor;
   forming a via photoresist pattern on said second dielectric layer with openings over said resistor heads and etching via openings through said second dielectric layer to said resistor heads;
   depositing a first metallic layer;
   forming a photoresist pattern with a high precision MIM capacitor bottom plate photoresist pattern and with a via etch stop landing pad photoresist pattern on said first metallic layer;
   etching said first metallic layer to form said high precision MIM capacitor bottom plate and to form via etch stop landing pads on said resistor heads;
   depositing a high precision MIM capacitor dielectric;
   depositing a second metallic layer;
   forming a high precision MIM capacitor top plate photoresist pattern on said second metallic layer; and etching said second metallic layer to form said high precision MIM capacitor top plate and to remove said second metallic layer from over said via etch stop landing pads.

9. The process of claim 8 further comprising:
depositing a capacitor encapsulation layer over said high precision MIM capacitor;
depositing an IMD layer over said capacitor encapsulation layer;
forming a via through said IMD layer and through said capacitor encapsulation layer to said high precision MIM capacitor bottom plate; a via to said high precision MIM capacitor top plate, and a via to said via etch stop landing pad.

10. The process of claim 8 where said high precision MIM capacitor bottom plate and said high precision MIM capacitor top plate consists of Ta, TaN, or a stack of Ta and TaN; said high precision MIM capacitor dielectric consists of a single layer of silicon nitride, silicon dioxide, silicon oxynitride or high-K dielectric or stacked layers of at least two of silicon dioxide, silicon nitride, silicon oxynitride, or high-K dielectric; and said high precision resistor consists of SiCr, NiCr, or TaSiN.

11. The process of claim 10 where said high precision MIM capacitor bottom plate is approximately 68 nm; said high precision MIM capacitor top plate is approximately 68 nm; said high precision MIM capacitor dielectric is approximately 30 nm; and said high precision resistor is approximately 3.4 nm SiCr.

12. The process of claim 10 where said bottom plate is approximately 68 nm TaN, said capacitor dielectric is approximately 30 nm silicon nitride, said capacitor top plate is approximately 68 nm TaN, and said high precision thin film resistor is approximately 3.4 nm SiCr.

13. The process of claim 8 where said hard mask is silicon dioxide or silicon nitride.

14. The process of claim 8 where said hard mask is approximately 10 nm of silane based oxide.

* * * * *